United States Patent [19]

Wittke

[11] 4,358,839

[45] Nov. 9, 1982

[54] ABSOLUTE DIGITAL CLOCK SYSTEM

[75] Inventor: Ernest C. Wittke, West Caldwell, N.J.

[73] Assignee: The Singer Company, Little Falls, N.J.

[21] Appl. No.: 35,118

[22] Filed: May 1, 1979

[51] Int. Cl.³ .................. G06F 1/04; G04B 17/12; H03B 5/32

[52] U.S. Cl. .................. 368/159; 368/200; 368/217; 331/162

[58] Field of Search .............. 368/155, 156, 157, 158, 368/159, 85-87, 200-202, 217-219; 331/2, 25, 22, 30, 46, 51, 55, 116 R, 154, 162, 172

[56] References Cited

U.S. PATENT DOCUMENTS

| | | | |
|---|---|---|---|
| 4,148,184 | 4/1979 | Akahane et al. | 368/159 |
| 4,159,622 | 7/1979 | Akahane | 368/85 |
| 4,244,043 | 1/1981 | Fujita et al. | 368/156 |

Primary Examiner—Vit W. Miska
Attorney, Agent, or Firm—L. A. Wright; T. W. Kennedy

[57] ABSTRACT

An absolute digital clock system which is capable of counting absolute time despite the disruptive effects of a nuclear event, or other disturbance, on the electronic circuitry of the system. The clock system of the invention includes a master quartz crystal oscillator stage, and a string of counter stages connected thereto each including a binary counter for counting down from the frequency of the preceding stage to a lower frequency, and each including a crystal oscillator phase-locked with the binary counter and producing a signal at the lower frequency. During the period of time when the radiation level is too high for adequate electronic functioning, the quartz crystals in the master stage and subsequent counter stages continue to vibrate without significant loss of phase information due to the high mechanical inertia of the quartz crystals, and this mechanical inertia of the various crystals is used in the system of the invention to enable the system to continue to indicate absolute time despite an interruption of substantial length as compared with the period of vibration of the individual crystals.

10 Claims, 3 Drawing Figures

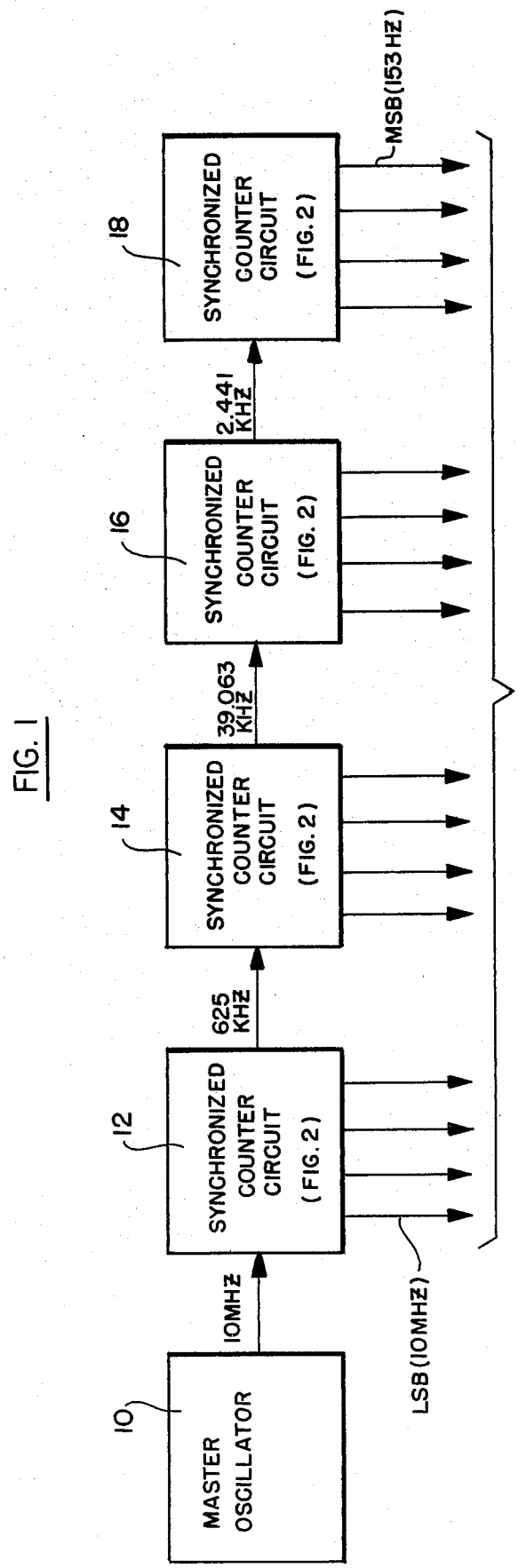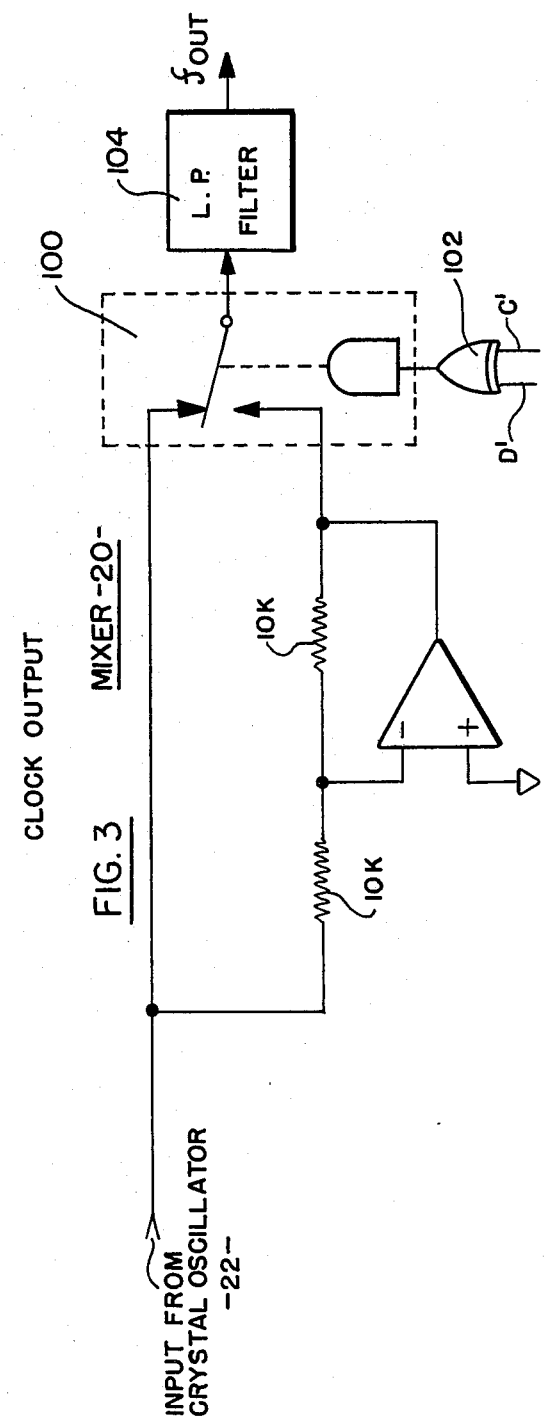

ABSOLUTE DIGITAL CLOCK SYSTEM

The United States Government has rights to the invention disclosed herein pursuant to Contract No. N00030-78-C-0100 awarded by the Department of the Navy.

BACKGROUND

In military electronic equipment such as missiles, for example, there is a requirement for a precision clock system which has the capability of designating absolute time despite short periods of functional disability of the electronic counting circuits in the clock system as the missile passes through a nuclear explosion region. Such periods usually are of the order of about 2 milliseconds, and are sufficient seriously to impair the navigational guidance control of the missile.

The prior art absolute clock systems ususally include a quartz crystal oscillator and associated electronic circuitry including a counter. During the period of time when the radioactive level is too high for the proper functioning of the electronic circuitry in the system, the prior art system has no means for determining the absolute elasped time during which the electronic circuitry was inactive.

However, due to its high mechanical inertia, the quartz crystal continues to vibrate during the interval without significant loss of phase reference data. Accordingly, the quartz crystal oscillations after the interruption continue to be in phase with its oscillations before the interruption. However, as mentioned above, in the prior art clock systems, there is no means for determining how many cycles of the crystal occurred during the interruption.

The principal objective of the present invention is to provide a multi-stage quartz crystal absolute clock system in which the mechanical inertia of the quartz crystal in each of its stages is used to determine absolute time, which determination is not impaired, even in the presence of an interruption in the functioning of the associated electronic circuitry, and even when such interruption is relatively long as compared with the period of oscillation of the various crystals.

In order to achieve the objectives of the present invention it is necessary for several requirements to be met. Specifically, the absolute clock system must contain a quartz crystal precision master oscillator whose operating frequency is sufficiently high so as to provide adequate time resolution; the clock must operate at a basic frequency which is sufficiently low so as to prevent ambiguity during an operation; and the frequency determining elements of the clock must be of a sufficiently high mechanical "Q" so that they will accurately track time during the period when the electronic circuitry is inoperative and provide a signal of the correct absolute phase on recovery of the electronic capability. The usual prior art electronic counter circuits cannot be employed in the absolute clock system of the invention since they acquire spurious numbers on reactivation after an interruption, so as to be no longer operational as a means for determining absolute time.

In the embodiment of the system of the present invention to be described, a master oscillator clock is provided which generates an output of 10 MHz, so that the frequency of the least significant bit (LSB) of the digital clock output signal is 10 MHz. The system of the invention also employs a number of cascaded counter stages which are interconnected and operate, for example, so that the most significant bit (MSB) of the digital output signal has a frequency of 153 Hz. In the system, each counter stage serves to divide down the master oscillater clock frequency from the frequency of the LSB to the frequency of the MSB.

The requirements for an absolute clock system which is capable of operation through the time interval of a nuclear event without loss of integrity are met in the system of the present invention by providing a master crystal oscillator at the highest required clock frequencies (10 MHz) with a sufficiently high "Q" so that phase accuracy will not be lost during an interruption of operation of the electronic circuitry; and a plurality of auxiliary crystal oscillators in the respective count-down stages which, in normal operation, are phase locked to suitable sub-multiples of the master oscillator. The count-down stages provide the various bits of the digital clock output of the absolute clock system of the invention. Each auxiliary crystal oscillator is required to have a sufficiently high "Q" to maintain its phase relationship to the next higher frequency auxiliary crystal oscillator during the period of interruption. Since the lower frequencies which are required to produce the higher significant bits in the digital clock output are unattainable directly with oscillators, these frequencies are obtained in the system to be described by beating two oscillator frequencies together in order to obtain a low value difference frequency.

BRIEF DESCRIPTION OF THE DRAWINGS

FIG. 1 is a block diagram of an absolute clock system which may be constructed in accordance with one embodiment of the invention, and which is capable of producing a multi-bit output signal representative of absolute time, even in the presence of interruptions in the functioning of the electronic circuitry in the system;

FIG. 3 is a logic diagram of a mixer circuit which may be used in the circuitry of certain of the blocks of the system of FIG. 1.

DETAILED DESCRIPTION OF THE ILLUSTRATED EMBODIMENT

Figure 2:
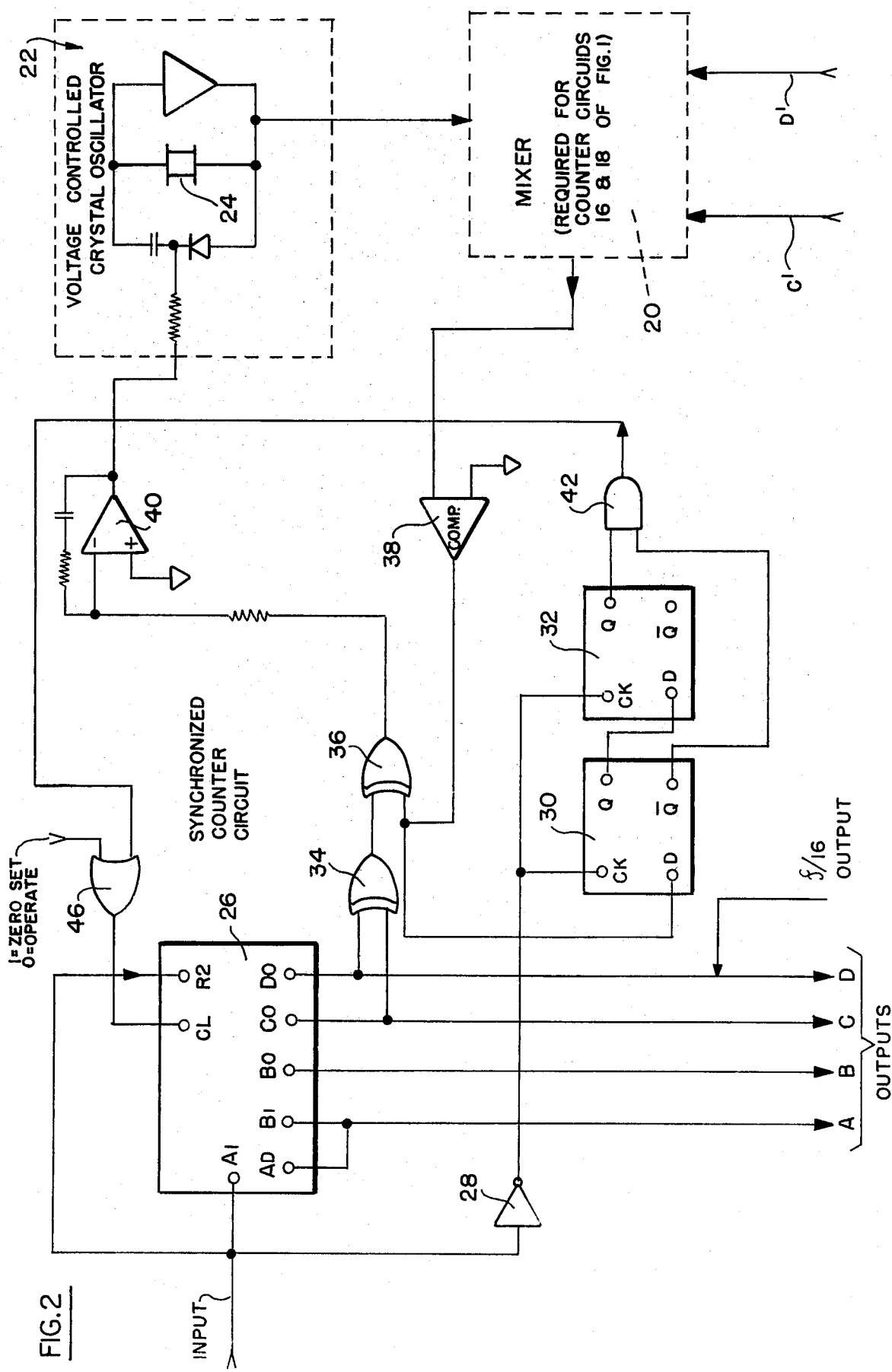
FIG. 2 is a diagram of the logic circuitry involved in each of a plurality of synchronized counter stages which are included in the system of FIG. 1.

The clock system shown in FIG. 1 includes a master oscillator 10 which, in turn, includes a stable quartz crystal oscillator of appropriate known construction which operates at a high resolution frequency. This frequency is selected to be 10 MHz in the illustrated embodiment. As mentioned above, the quartz crystal included in the master oscillator 10 must have a sufficiently high "Q" so that phase accuracy will not be lost during an interruption of the order, for example, of 2 milliseconds. The master oscillator 10 drives a string of four synchronizing count-down stages 12, 14, 16 and 18, each of which incorporates an auxiliary quartz crystal oscillator and a binary counter phase-locked with one another.

The synchronizing counters in the various count-down stages provide the clock output counts in the form of a 16-bit binary signal, whose most significant bit has a frequency of 153 Hz and whose least significant bit has a frequency of 10 MHz. Additional counts below the most significant bit can be unambiguously reconstructed by the use of bits stored in a hard-core memory because the period of the bits of such additional counts is long as compared with any radiation pulse interruption through which the system is capable of providing absolute time readings. Such interruptions usually are of the order of 2–3.2 milliseconds.

Each of the count-down blocks 12, 14, 16 and 18 of FIG. 1 incorporate logic circuitry such as shown in FIG. 2. The circuitry of FIG. 2 includes a sinusoidal voltage controlled quartz crystal oscillator 22, which, in turn, includes a high "Q" quartz crystal 24. As explained above, the system relies upon the ability of crystal 24 to continue to vibrate mechanically after the drive signal is lost for a certain period of time, for example, up to 2–3.2 milliseconds, and to maintain the phase of the vibration throughout that period.

The quartz crystal oscillator 22 in block 12 of FIG. 1 operates, for example, at 625 KHz; the quartz crystal oscillator in block 15 operates at a frequency of 39.063 KHz; the quartz crystal oscillator in block 16 operates at a frequency of 36.621 KHz; and the quartz crystal oscillator in block 18 operates at a frequency of 38.910 KHz. The logic circuitry of FIG. 2 includes a mixer 20 for the lower frequency blocks 16 and 18.

The circuit of FIG. 2 includes a synchronized counter 26 which may be an integrated circuit of the type designated 5493. The input to the circuit of FIG. 2, which is received from the preceding next-higher frequency block in FIG. 1, is introduced to pins $A_1$ and $R_2$ of counter 26, and through an inverter 28 to the clock terminals CK of a pair of D flip-flops 30, 32.

The input signal is counted down in counter 26, for example, by a factor of 16, and the four-bit outputs from the counter appear at terminals A, B, C and D, respectively, which are connected to pins $A_D$, $B_1$, $B_0$, $C_0$, $D_0$ of the counter.

The last two stages of counter 26 are connected through pins $C_0$ and $D_0$ to an exclusive-or gate 34, and this exclusive-or gate provides a ÷16 count which is in phase quadrature with the actual ÷16 count of the counter. The output of exclusive-or gate 34 provides an input to a second exclusive-or gate 36. Exclusive-or gate 36 serves as a phase detector. The other input to exclusive-or gate 36 is derived from a comparator 38. The output of the voltage controlled crystal oscillator 32 is introduced directly to comparator 38, when the circuit of FIG. 2 is incorporated into blocks 12 and 14 of FIG. 1; and through mixer 20 to the comparator when the circuit of FIG. 2 is incorporated into blocks 16 and 18. The quartz crystal oscillator is nominally tuned to the output frequency of the counter in the case of blocks 12 and 14, and the output of mixer 20 corresponds to the output frequency of the counter in blocks 16 and 18.

The output of the exclusive-or gate 36 provides an input signal to an integrator amplifier 40. The output of the integrator amplifier 40 drives the voltage control of the crystal oscillator 22. The effect is to produce a phase-locked loop which synchronizes the phase of the crystal oscillator 22 with the phase of the output signal of counter 26.

Inverter 28, D flip-flops 30, 32 and an "and" gate 42 provide reset circuitry which causes the counter 26 to be reset to zero on the first positive-going edge of the input signal following a negative-going edge of the signal from crystal oscillator 22, or mixer 20. During normal operation the reset circuitry has no effect since the reset pulse occurs at a time when the counter is already at zero. This is because during normal operation counter 26 resets itself to zero each time the counter counts to a frequency corresponding to the frequency of oscillator 22 or output frequency of mixer 20.

The reset action of the synchronized counter 26 is controlled by an "or" gate 46 which passes the reset pulse from the output of "and" gate 42 to the "clear" pin 62 of mixer 20. On start-up a second input to gate 46 is held at 1 until the cystal oscillator has had time to phase lock with the count from counter 26. Prior to phase lock, by appling a "1" to an "or" gate 46, the counter cannot be reset by the output of "and" gate 42.

As mentioned above, at the lower frequencies encountered in blocks 16 and 18 of FIG. 1, it is not possible to use the output of the crystal oscillator 22 directly to reset the counter 26 since the output frequency of the counter is too low for satisfactory crystal operation. Accordingly, mixer 20 is used in blocks 16 and 18 to generate the necessary low frequency reference from higher frequency crystal oscillators.

Mixer 20 has two particular requirements, that is, it must be linear to one of the frequencies, which must in turn be sinusoidal, and it must be driven in phase quadrature to the reference frequency for proper phase alignment between its output and the output of the counter.

The first requirement is met by supplying a sinusoidal push-pull signal D', C' from a quartz crystal reference oscillator, to a reversing switch 100 (FIG. 3); and the second requirement is met by causing the push-pull signals to drive the switch through an exclusive-or gate 102. Gate 102 is driven by the push-pull reference signals D', C' and their several harmonics. The use of a linear path to a sinusoidal signal assures that the difference output signal will be sinusoidal, allowing spurious mixer outputs to be removed by a low-pass filter 104. The R/L constant of the low pass filter is chosen to provide the desired 90° phase shift at the difference frequency for the output of the filter.

When the operation of the system of the invention is interrupted, for example, by a nuclear event, the count on counter 26 in each count-down stage is lost. However, the crystal 24 of crystal oscillator 22 in each count-down stage continues to vibrate without significant loss of phase with respect to the master oscillator 10 and, upon reactivation, will reset the counter at exactly the same time it would have been reset if no interruption had occurred, so that the system continues to provide an accurate absolute clock reading.

Providing that the output phase of the crystal oscillator 22 has not shifted by more than ±1/32 of a cycle from its proper angle with respect to the master oscillator, when mixer 20 is not used, or ±1/64th of a cycle when the mixer is used, the counter in the system will be reset to the same number it would have had if no interruption had occurred, and an absolute clock is achieved.

The need for retention of phase to an accuracy of 1/32 or 1/64 of a cycle for a period of time equal to half the period of the slowest counter produces tight but achievable requirements on the "Q" accuracy, and stability under radiation effects of the quartz crystals to be used. The requirements are as follows:

| Frequency | Absolute Accuracy | "Q" |
|---|---|---|
| 10 MHZ | $>6.5 \times 10^4$ | $>33000$ |
| 625 KHZ | $>6.5 \times 10^4$ | $>33000$ |
| 39063 KHZ | $>4.1 \times 10^3$ | $>2100$ |
| 36621 KHZ | $>7.66 \times 10^3$ | $>3900$ |

| Frequency | Absolute Accuracy | "Q" |
| --- | --- | --- |
| 38910 KHZ | >8.14 × 10³ | >4100 |

The above requirements are readily met with quartz crystals even under radiation. Vacuum swept quartz crystal have shown frequency stabilities under radiation pulses as high as one part in 10⁸, and "Q's" of several million.

It is necessary to assure that the effects of a nuclear blast on the electronics of the circuit will not interface excessively with the "Q" of the crystal 24. This can be achieved by providing resistor inputs to the amplifier 40, as shown.

While a particular embodiment of the invention has been shown and described, modifications may be made. It is intended in the claims to cover the modifications which come within the spirit and scope of the invention.

What is claimed is:

1. An electronic clock system for counting absolute time even in the presence of a disturbance which prevents electronic functioning of the system for a certain time interval, said system including:
    a master crystal-controlled oscillator whose crystal is adapted to continue to vibrate due to mechanical inertia for the duration of the time interval, and a series of count-down stages driven by said master oscillator and phase-locked to selected sub-multiples of the frequency of said master oscillator, each of said count-down stages including a binary counter driven by an input signal derived from a preceding stage;
    a crystal-controlled auxiliary oscillator whose crystal is adapted to continue to vibrate due to mechanical inertia for the duration of the time interval without loss of phase with respect to the crystal of said master oscillator;
    a phase-lock circuit intercoupling the counter to the auxiliary oscillator to phase-lock the auxiliary oscillator to a selected sub-multiple of the master oscillator frequency; and
    a reset circuit coupled to said auxiliary oscillator to cause said auxiliary oscillator to reset the counter in the event of said disturbance at the precise time said counter would normally be reset during normal operation of the system.

2. The system defined in claim 1, in which said auxiliary oscillator is directly connected to said counter to reset the counter at the proper instant in the event of said disturbance.

3. The system defined in claim 1, and which includes a mixer included in said reset circuit for heterodyning the output of said auxiliary oscillator with a reference frequency to produce a difference frequency for use in said reset circuit to reset the counter at the proper instant in the event of said disturbance.

4. The system defined in claim 1, in which said reset circuit includes circuitry responsive to the first positive-going edge of the input signal following a negative-going edge of the signal from the auxiliary crystal oscillator to reset said counter.

5. The system defined in claim 4, in which said reset circuit includes a pair of flip-flops.

6. The system defined in claim 3, in which said mixer is linear to at least one of the signals applied thereto, and is driven in phase-quadrature to the reference frequency.

7. The system defined in claim 6, in which said reference frequency comprises a pair of push-pull sinusoidal reference signals, and in which said mixer includes a switching means, and an exclusive-or gate responsive to said push-pull reference signals for producing an output signal for operating said switching means.

8. The system defined in claim 7, in which said mixer includes a low-pass filter for removing spurious signals from the output of the mixer.

9. The system defined in claim 8, in which said low pass filter has a resistance/capacitance constant selected to provide a 90° phase shift for the difference frequency signal passed by the filter.

10. The system defined in claim 1, in which said master oscillator and said auxiliary oscillator each include a quartz crystal.

* * * * *